Feb. 3, 1970 E. L. ZUCH 3,493,881
UNITY GAIN AMPLIFIER
Filed June 25, 1968
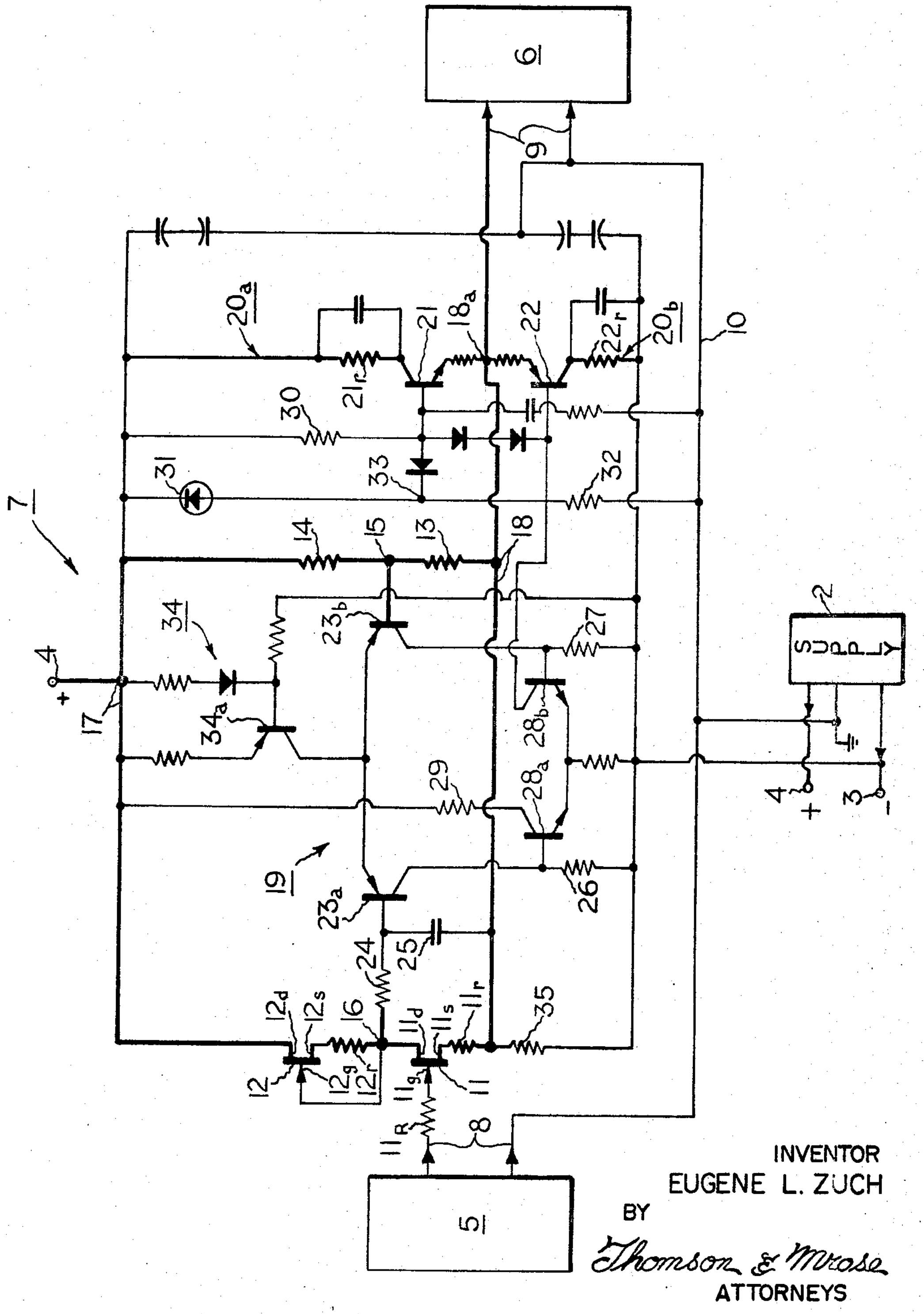
INVENTOR
EUGENE L. ZUCH
BY
Thomson & Mrose
ATTORNEYS 3,493,881

UNITY GAIN AMPLIFIER

Eugene L. Zuch, Belmont, Mass., assignor to Intronics Incorporated, Newton, Mass., a corporation of Massachusetts Filed June 25, 1968, Ser. No. 739,883
Int. Cl. H03f 3/04
U.S. Cl. 330—24 7 Claims

ABSTRACT OF THE DISCLOSURE

Precise electronic unity-gain amplification of both positive and negative signals over relatively wide voltage and temperature ranges is achieved using a matched pair of field-effect transistors in a bridge-configuration network wherein a two-stage balanced amplifier provides feedback which reliably forces output signals into non-inverted conformity with the input.

Background of the invention

The present invention relates to improvements in electronic circuitry, such as amplifiers which are especially well suited for non-inverting unity-gain applications, and, in one particular aspect, to novel and improved miniature solid-state amplifiers of general utility which require no adjustments to insure accurate reproductions of both positive and negative input signals over broad ranges of temperatures and frequencies and which make available desirable isolations and impedance transformations.

Electronic amplifiers are of course well known in many forms and serve a wide variety of purposes; in some instances, particularly where solid-state devices are employed, effects of temperature variations upon the operating characteristics of such devices can detract seriously from faithful amplification, and, further, the need for optimum performance often dictates that the circuitry be adjusted on occasion, such that desirable fully-protected monolithic packaging or encapsulation is then not feasible. High precision is essential in measurement applications, for example, and oftentimes the principal functions do not necessarily involve amplification in the usual sense but, instead, a buffering between coupled input and output equipments, and/or improved matching between coupled equipments having different impedance characteristics, and/or high current gain with merely unity voltage gain.

Field-effect transistors advantageously exhibit extremely high input impedances which tend to make such devices attractive for use in circuitry wherein they can be well matched with correspondingly high impedance equipments, but their temperature dependence tends to affect their responses adversely. According to practices expressing the present teachings, such difficulties may be reliably and predictably overcome through use of a pair of such transistors which are substantially matched in one operating mode and which constitute different substantially active and passive arms of a bridge-type network the excitation of which is automatically adjusted to maintain balance by an associated amplifier in such a manner that the amplifier outputs precisely characterize the input to one of the transistors.

Summary

Efficient, low-distortion, and self-compensating amplifications, with high current (hence, power) gain, are readily assured by miniature improved solid-state networks which can be fully encapsulated into substantially monolithic modules embodying the present invention. Uniquely, a balanced-amplifier portion of such networks, responsing to both senses of unbalances of a bridge-type circuit in the same network, is forced to develop output signals fatihfully corresponding to such input signals as originally cause unbalanced conditions in the bridge-type circuit. In causing the associated bridge-type circuit to maintain balance, the balanced amplifier output signals must closely track the input signals with which they are automatically compared, and its own precise self-regulated operation is thus assured. Conveniently, the gate electrode of a field-effect transistor in one arm of the bridge-type circuit receives the network input signals, and the balanced-amplifier outputs cause the source electrode of the same transistor to be held at the same level as the input signals, thereby maintaining essentially a shorted gate-source mode of operation for the transistor. A similar transistor, which in fact has a substantially shorted gate-source connection, serves as a counterbalancing bridge arm for the first transistor. An initial matching selection of the two field-effect transistors, insuring that their currents are substantially the same for any applied voltage under otherwise standard conditions, insures that the network output voltage will always be the same as the input voltage, within the accuracy of that transistor matching.

It is one of the objects of the present invention, therefore, to provide unique and improved solid-state DC amplifiers capable of precise reproductions of both positive- and negative-going signals under adverse environmental conditions.

Another object is to improve electronic amplifications through use of a balanced amplifier which, in automatically providing servo-type feedback signals for purposes of balancing a bridge array including field-effect transistors, must simultaneously develop electrical outputs which accurately and instantaneously track the input signals to one of the transistors.

Further, it is an object to provide unique and highly versatile electronic unity-gain DC amplifier circuitry reliably exhibiting improved temperature stability and requiring no external adjustments to maintain optimum performance.

By way of a summary account of practice of this invention in one of its aspects, each of a pair of matched field-effect transistors and of a pair of resistances is connected as a separate arm of a bridge-configuration circuit which has one set of terminals energized from a source and has another set of terminals connected to the input of an associated two-stage balanced amplifier. The two field-effect transistors are disposed in adjacent arms where they must appear in a series current-conducting relationship and are thus assured of carrying the same current. One of these transistors, has its gate shorted to its source electrode, while the other has its gate excited by the input signals to be amplified and its source is independently connected to vary with the output signals developed by the two-stage balanced amplifier. Under balance conditions, the source of the other transistor must be driven to precisely the same voltage as is applied as input to its gate, and the output of the two-stage amplifier which is responsible for that driving is thus a faithful non-inverted reproduction of the system input.

Although the features of this invention which are considered to be novel are set forth in the appended claims, further details as to preferred practices and as to the objects and advantages thereof may be most readily comprehended through reference to the following description taken in connection with the accompanying drawing.

Brief description of the drawing

The drawing comprises a schematic illustration of an improved unity-gain non-inverting DC amplifier, in association with block-diagrammed input, output and supply equipment.

Description of the preferred embodiment

The system appearing in the drawing includes a DC electrical power supply 2, of a known stable type including equal and opposite positive and negative voltage terminals, 3 and 4, and electrical input and output equipment, 5 and 6, respectively, which may comprise any known circuits or devices which will benefit especially from buffering or impedance transformations provided by the intermediate network 7. The latter network characteristically exhibits an extremely high input impedance by way of its input connections 8, and a desirably relatively low output impedance by way of its output connections 9; as illustrated, these include a common reference-potential or circuit "ground" connection 10.

An input stage of the network 7 employs the pair of field-effect transistors, 11 and 12, and the pair of impedances in the form of resistances 13 and 14, which are interconnected in a bridge-circuit configuration. Voltage input from equipment 5 is applied to the gate 11*g* of one of the two FET's (field-effect transistors), through a resistance 11R which is selected to have a relatively high resistance value (such as 150,000 ohms), and the impedance characteristic of conductive path between the source 11*s* and drain 11*d* of that FET comprises the principal impedance in a first one of the arms of the bridge-circuit configuration. Similarly, the impedance (resistance) of the conductive path between the source 12*s* and drain 12*d* of FET 12 comprises the principal impedance in a second arm of the bridge, adjacent the first; resistances 13 and 14 comprise adjacent third and fourth arms. The junction 15 between resistances 13 and 14, and the junction 16 between the drain 11*d* of transistor 11 and source 12*s* of transistor 12, comprise output connection points for the bridge-type circuit. Electrical excitation input connection points for the same circuit are provided by the junction 17 between the drain 12*d* of transistor 12 and resistance 14, and by the junction 18 between the source 11*s* of transistor 11 and resistance 13. In the preferred arrangement, resistances 13 and 14 are of substantially the same value, and, because they are connected in series between the excitation points 17 and 18, the voltage appearing at their junction 15 is midway between those applied at the said excitation points. The source-drain current paths of FET's 11 and 12 are likewise in series between the same excitation points, and they must therefore carry the same current at all times. Provided the conductivities of these FET current paths are the same, the voltage appearing at the junction 16 between these transistors will also lie midway between those applied at the excitation points 17 and 18, and there is no difference between the potentials appearing at the two output points 15 and 16.

Whether the conductivities of the source-drain paths of FET's 11 and 12 are the same depends upon their conditions of relative excitations, i.e., upon the electrical relationships of gate, source and drain electrodes for each, and also upon the individual characteristics of each of these transistors. In the latter connection, it is important for present purposes that the two FET's 11 and 12 be selected such that their electrical characteristics have a certain simple match which will pre-establish that, in their series connection, their source-drain path conductivities will be substantially the same for the critical condition when the source and gate electrodes of each have substantially the same potetnials. This type of match is achieved very readily in an empirical fashion merely by applying a predetermined voltage across the source-drain electrodes of FET's and measuring the current which flows while the source and gate are shorted to insure that they are at the same potential; those FET's which yield the same current measurement under such conditions may be paired to serve as the two FET's 11 and 12 in the system under discussion.

As is shown in the drawing, FET 12 is used as essentially a "passive" type transistor, with its gate 12*g* substantially shorted to its source 12*s*. A small resistance 12*r*, of but a few ohms, may be desirable in some instances to provide a slight trim for minor mis-match between the FET's 11 and 12, and the same is true of resistance 11*r* associated with transistor 11; either, or neither, may be required, depending upon the conditions to be met. Environmental influences on the electrical characteristics of the two matched FET's, such as temperature variations, will cause their respective characteristics to correspond closely nevertheless, with the result that the system operation, discussed in greater detail hereinafter, will not be seriously affected over a desirably wide range of such environmental variations.

The input signals to be amplified with unity gain by the system are impressed upon gate 11*g* of transistor 11, and will of course tend to affect the conductivity of the path between source electrode 11*s* and drain electrode 11*d*. If the input happens to be exactly the same as the voltage level appearing at source 11*s*, then the FET 11 behaves as though its source electrode 11*s* and gate electrode 11*g* were shorted; an actual shorted gate-source condition is of course present in FET 12, and hence the voltage level at junction 16 is midway between the voltages at points 17 and 18 and is the same as the voltage at junction 15 between the two resistances 13 and 14. Hence, for such a condition, no voltage-difference output appears between output points 16 and 15 of the bridge-circuit configuration, and there is a "balance." However, as soon as the to-be-amplified input voltage applied to gate 11*g* differs from that at source 11*s*, the conductivity of the path between source electrode 11*s* and drain electrode 11*d* becomes different from that between source electrode 12*s* and drain electrode 12*d* of the companion FET 12, and the voltage at point 16 varies according, up or down in relation to the voltage at the related output point 15. Depending upon the direction or polarity of the voltage difference appearing between output points 15 and 16, an associated two-stage balanced amplifier unit 19 will rapidly cause the voltage level at source 11*s* to vary in precisely the sense and to precisely the same value as the value of the input signal at the system input gate electrode 11*g*. This is accomplished by its automatically varying the current through paths 20*a* and 20*b* of complementary driver transistors 21 (shown as an NPN type) and 22 (shown as a PNP type), the current-conducting paths of which are independently connected between the critical circuit point 18 and a different side of the double-ended power supply 2.

A preferred form of balanced amplifier construction for controlling the driver transistors is shown to include two similar first-stage amplifier transistors 23*a* and 23*b* (both shown as PNP type) each of which has a different one of the potentials appearing at junctions 16 and 15 applied to its base. Where desirable, a stabilizing network including a series resistance 24 and shunt capacitance 25 may be used, as shown in association with the base electrode of transistor 23*a*, to improve phase response of the system. Load resistances 26 and 27 are connected with transistors 23*a* and 23*b* in a conventional way, and second-stage amplifier transistors 28*a* and 28*b* (both shown as NPN type) respond to the first-stage outputs in a known manner by developing outputs associated with their respective load resistances 29 and 30. A single-ended output from the second-stage transistors, appearing in association with resistance 30, excites the complementary-driver transistors 21 and 22. In the circuitry of the latter, resistances 21*r* and 22*r* serve as current-limiting elements. Zener diode 31 and resistance 32 serve to provide an anti-latchup clamping voltage at point 33 which will not exceed a selected maximum. The balanced amplifier 19 is also preferably driven via a temperature-stable constant-current network 34, involving the transistor 34*a* and the usual association of other components.

The driver transistors 21 and 22 are responsive to the balanced-amplifier output, and, in association with their series resistances, serve to shift the potential at point 18*a*, which is electrically the same as point 18 and one side of the output connections 9, in a rapid automatic fashion which causes that potential to track the voltage applied as input to gate 11*g* by input equipment 5. The bridge-type circuit described earlier is continuously being rebalanced as the input to gate 11*g* varies, and the balancing is unique in that the excitation for that circuit is likewise continuously varied as needed. In the course of such tracking, an output like the input, i.e. unity-gain non-inverted, is provided. Output equipment 6 is advantageously completely buffered in relation to the input equipment 5, and the system outputs are advantageously at relatively low impedance and are available at high current, and, hence, power (example: current gain of $10^8$). Input to the system is advantageously at a relatively high impedance level, and the aforementioned high input resistance 11R both protects the input of FET 11 by limiting possible current input and, in association with the input capacitance (gate-drain) of transistor 11, serves to shape the frequency response of the system in a beneficial manner. In essence the aforesaid resistance 11*R* and intrinsic gate-drain capacitance form an RC filter which prevents very high frequencies from flowing and causing bad distortion of low-frequency components of signals being amplified by the system; additional capacitance may of course be added to augment this effect. Resistance 35 is used to present a driving impedance in the absence of other loading of the system, or where the loading has effectively a substantially infinite impedance.

It should be understood that the specific preferred embodiments and practices which have been illustrated and described herein have been presented by way of disclosure rather than limitation, and those skilled in the art will appreciate that various modifications, combinations, substitutions and alternative uses may be effected without departure from the spirit and scope of this invention in its broader aspects and as set forth in the accompanying claims.

What I claim as new and desire to secure by Letters Patent of the United States is:

1. Electronic signal-translating equipment comprising a pair of electrical semiconductor devices each having a current path the effective conductance of which may be modulated in accordance with a difference between two potentials existing at different electrodes of each said device, a pair of electrical impedances, means connecting said impedances and said devices into a four-arm bridge-circuit configuration wherein said impedances and devices each comprise a different arm thereof and wherein first diagonal connections constitute output connections and second diagonal connections constitute excitation connections of said bridge circuit configuration, means maintaining the said difference in potential at said different electrodes of one of said devices substantially fixed, input means for independently applying potentials to one of said different electrodes of the other of said devices, said connecting means including means applying to the other of said different electrodes of said other of said devices potentials comprising excitation potentials for said bridge-circuit configuration of said devices and impedances, balanced amplifier means producing output signals, means applying as input to said amplifier means signals characterizing differences in potentials appearing across first diagonal connections of said bridge-circuit configuration of said devices and impedances, whereby said amplifier means is responsive to said differences in potentials appearing across said first diagonal connections, driver means, means applying said output signals to said driver means, and means connecting said driver means to apply potentials across second diagonal connections of said bridge-circuit configuration of said devices and impedances' one of said potentials applied by said driver means corresponding to said excitation potentials applied to said other of said devices, whereby electrical characteristics of said driver means are accurately related to said potentials applied to said one of said different electrodes of said other of said devices.

2. Electronic equipment as set forth in claim 1 wherein each of said devices comprises a transistor, wherein the said potentials in accordance with which conductance of each said device is modulated are potentials existing at the control electrode and at another electrode thereof, and wherein said potentials applied to said one of said different electrodes of the other of said devices are potentials at the control electrode thereof.

3. Electronic equipment as set forth in claim 1 wherein said connecting means includes means connecting the said current paths of said devices in a series relationship wherein they conduct the same current in said bridge-circuit configuration and means connecting the said impedances in a series relationship wherein they conduct the same current in said bridge-circuit configuration.

4. Electronic equipment as set forth in claim 1 wherein said impedances comprise substantially equal resistances, and wherein said devices are substantially matched to exhibit substantially the same conductance with the same said difference between potentials applied thereto.

5. Electronic equipment as set forth in claim 4 wherein each of said devices comprise a field-effect transistor, wherein the said difference between two potentials in accordance with which conductance of each said device is modulated is difference between potentials at the gate and source electrodes thereof, wherein said means maintaining the said difference in potential of one of said devices substantially fixed comprises substantially a shorting connection between the gate and source electrodes thereof, wherein said means for independently applying potentials to one of said difference electrodes of the other of said devices includes a relatively high resistance in series with the gate electrode of said other of said devices, and wherein said driver means applies as said one of said potentials across said second diagonal connections potentials equal to the gate electrode potentials of said other of said devices.

6. Electronic equipment as set forth in claim 5 wheresame value of current flow therethrough when the same value of voltage is applied across their source and drain electrodes while their gate electrodes are substantially shorted to their source electrodes and other conditions are substantially the same.

7. Electronic unity-gain non-inverting amplifier equipment comprising a pair of field-effect transistors having a first connection of the drain electrode of one with the source electrode of the other, means connecting said transistors in a series relation between two points of different electrical potential, means including a relatively high resistance for applying variable input voltages to the gate electrode of said one of said transistors, means establishing substantially a shorting between the source and gate electrodes of the other of said transistors, said field-effect transistors exhibiting substantially the same value of current flow therethrough when the same value of voltage is applied across their source and drain electrodes while their gate electrodes are substantially shorted to their source electrodes and other conditions are substantially the same, a pair of substantially equal resistances having a second connection therebetween, means connecting said resistances in a series relationship between said two points of different potential, a balanced amplifier, means applying as two input potentials to said amplifier the potentials at said first and second connections, output driving means, means connecting said output driving means for response to output of said balanced amplifier, and means connecting said output driving means to apply to said one of said points which is in common with said source electrode of said one of said field-effect transistor variable potentials which are substantially instantaneously equal to said input voltages to said gate electrode thereof, whereby said variable potentials accurately characterize said input voltages.

References Cited

UNITED STATES PATENTS 3,077,566 2/1963 Vosteen ------------ 330—30 X

OTHER REFERENCES

Murphee et al.: "High-Gain DC Amplifier Drives CRT Display," Electronics, June 29, 1964, p. 53.

ROY LAKE, Primary Examiner

L. J. DAHL, Assistant Examiner

U.S. Cl. X.R.

330—30, 38